(12) United States Patent
Wagner, Jr. et al.

(10) Patent No.: US 7,863,691 B2
(45) Date of Patent: Jan. 4, 2011

(54) MERGED FIELD EFFECT TRANSISTOR CELLS FOR SWITCHING

(75) Inventors: Lawrence F. Wagner, Jr., Fishkill, NY (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 404 days.

(21) Appl. No.: 12/045,159

(22) Filed: Mar. 10, 2008

(65) Prior Publication Data
US 2009/0224334 A1    Sep. 10, 2009

(51) Int. Cl.
*H01L 27/10* (2006.01)
(52) U.S. Cl. .............. 257/401; 257/393; 257/E29.001; 438/129; 438/130
(58) Field of Classification Search .......... 257/393, 257/401
See application file for complete search history.

(56) References Cited
U.S. PATENT DOCUMENTS
4,843,440 A * 6/1989 Huang .................. 257/256
5,796,674 A * 8/1998 Matsuura ................ 365/233.5
7,098,755 B2   8/2006 Zhao et al.

* cited by examiner

*Primary Examiner*—Marcos D. Pizarro
*Assistant Examiner*—Eva Yan Montalvo
(74) *Attorney, Agent, or Firm*—Gibb I.P. Law Firm, LLC; Richard M. Kotulak, Esq.

(57) ABSTRACT

Disclosed are embodiments of an improved integrated circuit switching device that incorporates multiple sets of series connected field effect transistors with each set further connected in parallel between two nodes. The sets are arranged in a linear fashion with each set positioned such that it is in contact with and essentially symmetrical relative to an adjacent set. Arranging the sets in this manner allows adjacent diffusion regions of the same type (i.e., sources or drains) from adjacent sets to be merged. Merging of the diffusion regions provides several benefits, including but not limited to, reducing the device size, reducing the amount of required wiring for the device (i.e., reducing resistance) and reducing side capacitance between the now merged diffusion regions and the substrate. Also disclosed are embodiments of an associated design structure for the device and an associated method of forming the device.

20 Claims, 8 Drawing Sheets ive an improved
MERGED FIELD EFFECT TRANSISTOR CELLS FOR SWITCHING

BACKGROUND OF THE INVENTION

The embodiments of the invention generally relate to integrated circuit devices and, more particularly, to an improved integrated circuit switching device with merged field effect transistor (FET) cells for minimized series resistance as well as minimized parasitic capacitance in order to avoid signal frequency losses.

Numerous integrated circuit applications require switching. Most integrated circuit switching devices (i.e., switches) are implemented with one or more field effect transistors (FETs). A simple FET switch functions by selectively applying a voltage on the FET in order to create a low resistance signal path in the FET channel region between the FET drain and source regions. However, losses in the frequency of this signal as it passes through the channel region can occur due to a number of different factors. For example, parasitic capacitance between the wafer substrate and the drain region, source region and channel region of the FET can cause such a frequency loss. As the frequency of the signal increases, loss due such parasitic capacitances also increases. Series resistance in the FET wiring is also a factor. Furthermore, if multiple FETs are incorporated into a single switching device, such parasitics become an even greater factor in signal frequency losses.

Therefore, there is a need in the art form an improved integrated circuit switching device having minimized series resistance as well as minimized parasitic capacitance in order to avoid signal frequency losses.

BRIEF SUMMARY OF THE INVENTION

In view of the foregoing, disclosed herein are embodiments of an improved integrated circuit switching device that incorporates multiple sets of series connected field effect transistors (FETs) with each set further connected in parallel between two nodes (e.g., between a current source and ground). The sets are arranged in a linear fashion with each set positioned such that it is in contact with and essentially symmetrical relative to an adjacent set. Arranging the sets in this manner allows adjacent diffusion regions of the same type (i.e., sources or drains) from adjacent sets to be merged. Merging of the diffusion regions provides several benefits, including but not limited to, reducing the device size, reducing the amount of required wiring for the device (i.e., reducing resistance) and reducing side capacitance between the now merged diffusion regions and the substrate. Also disclosed are embodiments of an associated design structure for the device and an associated method of forming the device.

More particularly, disclosed herein are embodiments of an improved integrated circuit switching device. The device can comprise a first node and a second node. The device can further comprise multiple sets of series connected FETs. Each set can comprise at least a first FET and a last FET. The first FET can comprise a first diffusion region (e.g., a drain region) that represents the start of the series and that is electrically connected to the first node, whereas the last FET can comprise a last diffusion region (e.g., a source region) that represents the end of the series and that is electrically connected to the second node. Thus, the multiple sets are connected in parallel between the first node and the second node.

The number n of FETs in each set can vary depending upon the voltage drop expected when the device is turned off and also on the voltage rating of the FETs being used. For example, if the first node is a current source with a specified voltage peak, if the second node is ground, and if each of the FETs in each of sets is rated to the same specified voltage, then the total number n of FETs in each of the multiple sets can be approximately equal to the specified voltage peak of the current source divided by the specified voltage at which the FETs are rated so that the voltage drop that occurs when the device is turned off is shared between the FETs. The number m of sets can vary depending upon the desired overall channel width for the device. For example, the number m of sets can be approximately equal to the desired overall channel width for the device divided by the channel width of the FETs themselves.

As mentioned above, one particular aspect of the device is the merging of diffusion regions between adjacent sets. That is, the first diffusion region and/or the last diffusion region from each set can comprise a shared diffusion region with an adjacent set. Specifically, the sets are arranged in a linear fashion such that each set is in contact with and essentially symmetrical relative to at least one adjacent set and further such that all gates of all of the FETs in all of the multiple sets are parallel and aligned. As a result of the arrangement of the sets and the shared diffusion regions, a signal will pass through one set of FETs in a first direction and through another adjacent set in a second direction opposite the first direction.

Also disclosed herein are embodiments of a method of forming the above-described integrated circuit switching device. The method embodiments comprise predetermining the number m of sets of series connected FETs required for the device. Specifically, the desired overall channel width for the device is determined. Also, the FET that will be used in the device is specified and the channel width of that FET is determined. Next, the desired overall channel width for the device is divided by the channel width of the FET in order to predetermine the required number m of sets.

Additionally, the number n of FETs that will be connected in series in each set is also predetermined. Specifically, the current source that will be used at the first node is specified and the voltage peak for that current source is determined. The voltage rating of the FETs that will be used in the device is also determined. Then, the voltage peak of the current source is divided by the voltage at which the FETs are rated in order to predetermine the number n of FETs that are to be connected in series in each set and that will share the resulting voltage drop, when the device is turned off.

Next, a wafer is provided and m sets of n series connected FETs are formed on the wafer. The series connected FETs in each set are particularly formed such that the first FET comprises a first diffusion region (e.g., a drain region) that represents the start of the series and such that the last FET comprises a last diffusion region (e.g., a source region) that represents the end of the series. The series connected FETs are further formed such that the first diffusion region and/or the last diffusion region of each set comprises a shared diffusion region with an adjacent set. This can be accomplished, for example, by arranging the sets in a linear fashion such that each set is in contact with and essentially symmetrical relative to at least one adjacent set and further such that all gates of all of the FETs in all of the multiple sets are parallel and aligned. Thus, in the resulting structure a signal will pass through one set of FETs (e.g., a first set) in a first direction and through another set of FETs (e.g., a second set adjacent the first set) in a second direction opposite the first direction.

After the multiple sets of series connected FETs are formed, the multiple sets can be electrically connected in parallel between a first node (e.g., to an alternating current (A/C) source) and a second node (e.g., to ground) by electrically connecting the first diffusion region of each of the multiple sets to the first node and further by electrically connecting the last diffusion region of each of the multiple sets to the second node.

Several direct and indirect benefits result from the arrangement of the sets in the integrated circuit switching device of the present invention, as described above and formed according to the method of the present invention, also as described above. For example, the required amount of device wiring is reduced because the signal to and/or from adjacent sets passes on common (i.e., shared) wiring between a shared diffusion region and a corresponding node. Reducing the device wiring to the nodes in turn minimizes series resistance when the integrated circuit device is turned on and, thereby enhances device performance. Additionally, the size of the integrated circuit device can be minimized (i.e., scaled). Scaling the device in turn minimizes several parasitic capacitances that degrade device performance.

Also disclosed are embodiments of a design structure for the above-described integrated circuit switching device. The design structure is embodied in a machine readable medium, resides on a storage medium as a data format used for the exchange of layout data of integrated circuits and comprises, for example, a netlist.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope the invention without departing from the spirit thereof, and the invention includes all such changes and modifications.

BRIEF DESCRIPTION OF SEVERAL VIEWS OF THE DRAWINGS

The embodiments of the invention will be better understood from the following detailed description with reference to the drawings, in which.

DETAILED DESCRIPTION OF THE INVENTION

Figure 1:
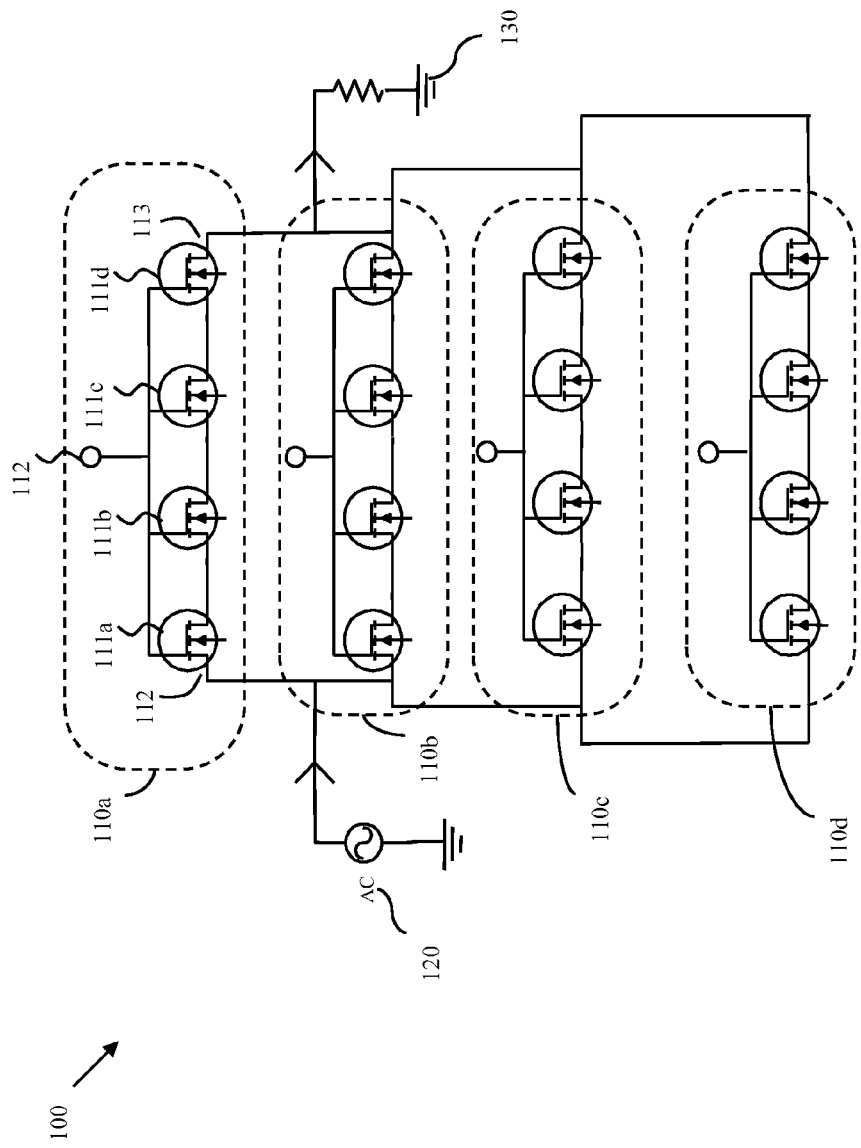
FIG. 1 is a schematic diagram of an integrated circuit switching device 100.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, numerous integrated circuit applications require switching. Most integrated circuit switching devices (i.e., switches) are implemented with one or more field effect transistors (FETs). A simple FET switch functions by selectively applying a voltage on the FET in order to create a low resistance signal path in the FET channel region between the FET drain and source regions. However, losses in the frequency of this signal as it passes through the channel region can occur due to a number of different factors. For example, parasitic capacitance between the wafer substrate and the drain region, source region and channel region of the FET can cause such a frequency loss. As the frequency of the signal increases, loss due such parasitic capacitances also increases. Series resistance in the FET wiring is also a factor.

Figure 2:
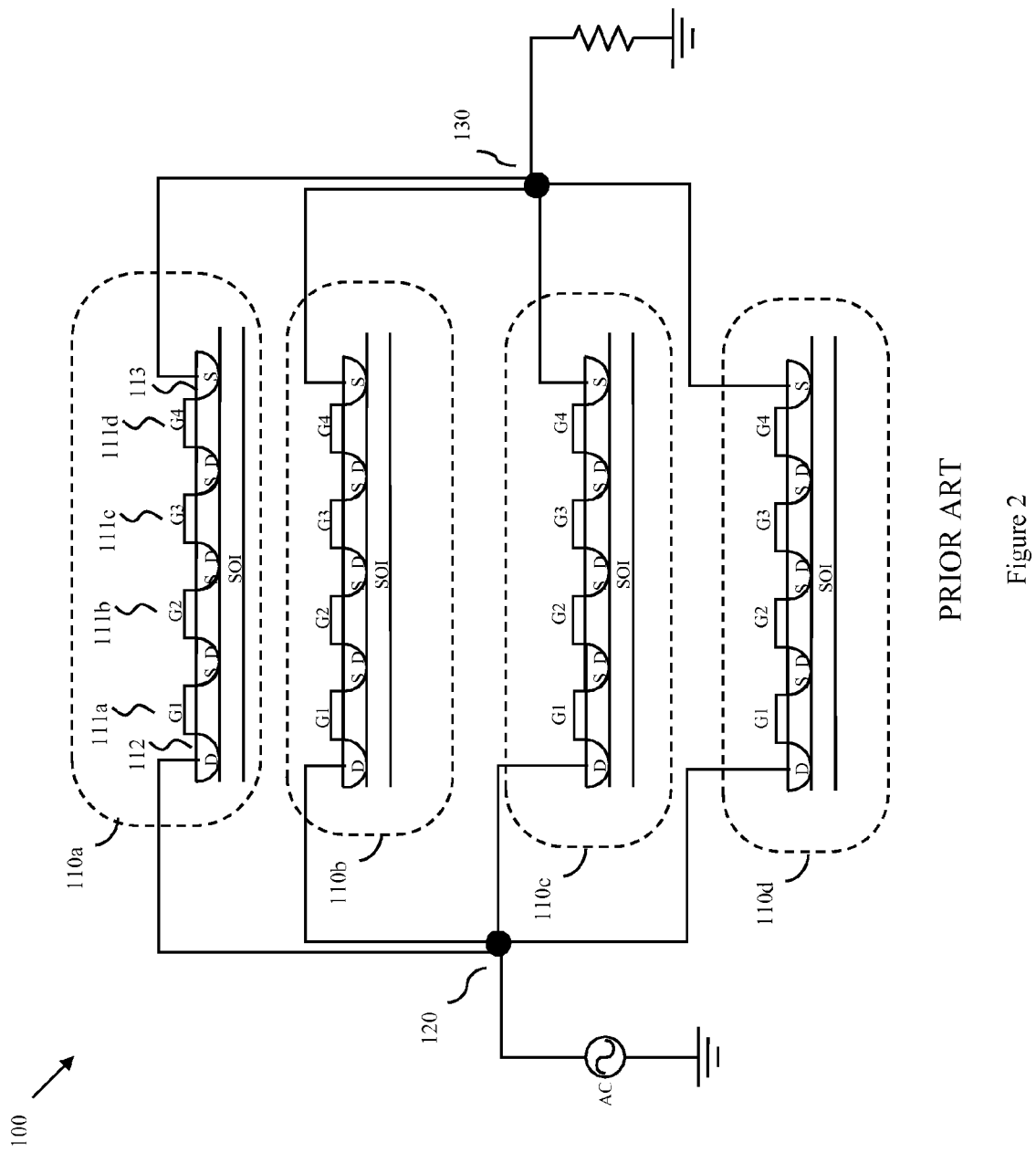
FIG. 2 is a diagram illustrating a cross-section of a die or chip containing such a device 100.
Figure 3:
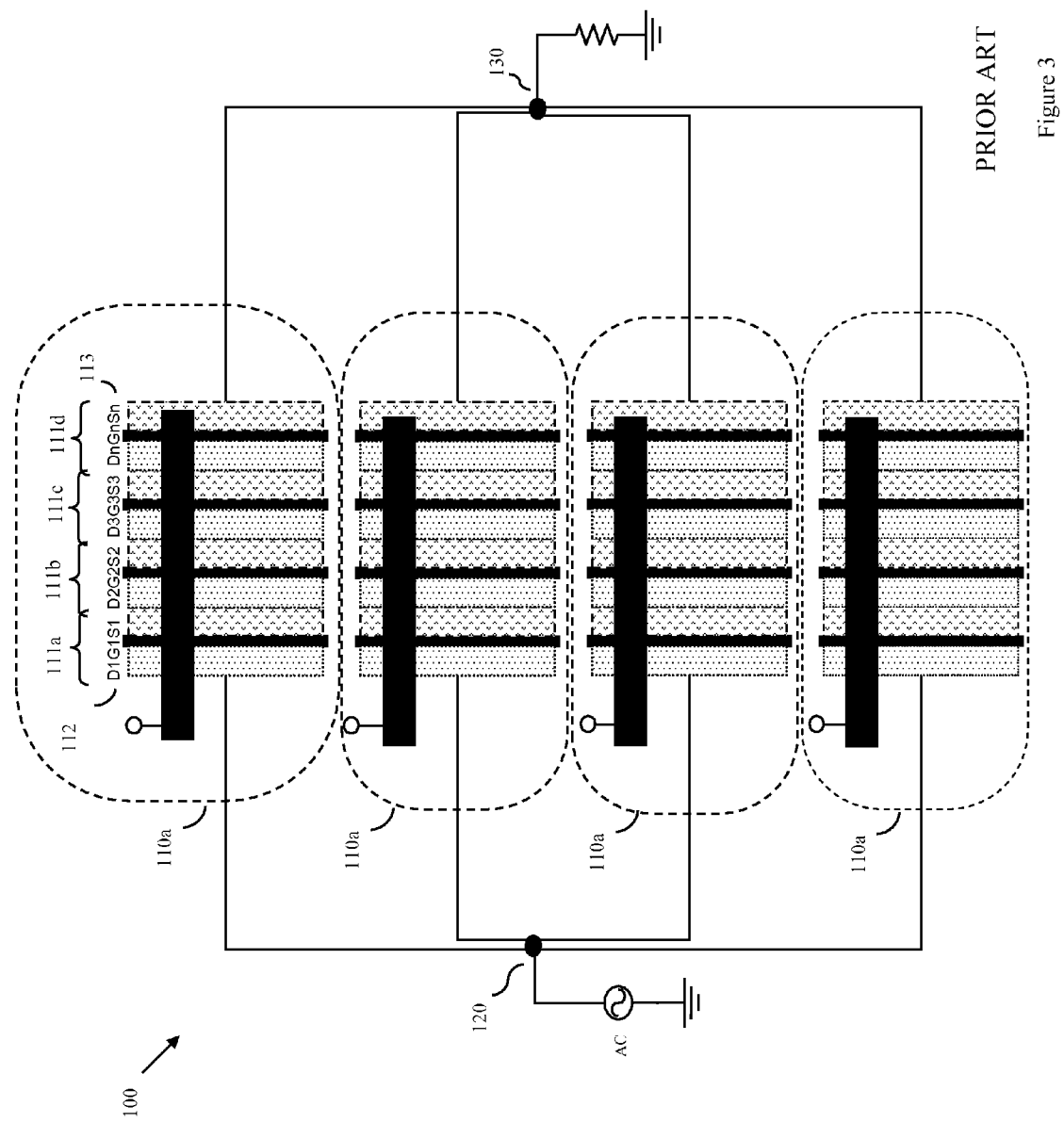
FIG. 3 is a diagram illustrating a top view of a die or chip containing such a device 100.

Furthermore, if multiple FETs are incorporated into a single switching device, such parasitics become an even greater factor in signal frequency losses. More specifically, FIG. 1 is a schematic diagram of a prior art integrated circuit switching device 100 incorporating multiple FETs. FIG. 2 is a diagram illustrating a cross-section of a die or chip containing such a device 100. FIG. 3 is a diagram illustrating a top view of a die or chip containing such a device 100. Referring to FIGS. 1-3 in combination, the switching device 100 comprises multiple sets (i.e., cells, blocks, series, etc.) of FETs (e.g., a first set 110a, a second set 110b, a third set 110c through a last or nth set 110d) Each cell 110a-d comprises multiple FETs 111a-d electrically connected in series. That is, each set 110a-d comprises a plurality of FETs (e.g., a first FET 111a, a second FET 111b, a third FET 111c through a last or nth FET 111d) and these FETs 111a-d are electrically connected in series with the source region of one FET (e.g., 111a) in contact with the drain region of a subsequent adjacent FET (e.g., 111b) in the series. Additionally, the drain region 112 of each first FET 111a in each set 110a-d is electrically connected to a first node 120 (e.g., an alternating (A/C) current source) and the source region 113 of each nth FET 111d in each set 110a-d is electrically connected to a second node 130 that is different from the first node 120 (e.g., to ground). Thus, the sets 110a-d are electrically connected in parallel and function as a single switch. Different reasons exist for incorporating multiple FETs connected in series and/or in parallel in a single switching device.

For example, rather than using a single FET as a switch, multiple FETs can be connected in series in order to share a voltage drop, when the switching device is turned off. For example, in the case of device 100, if the peak voltage at the first node 120 (i.e., from the current source) is 10 volts and if the second node 130 is grounded, the four FETs 111a-d connected in series in each set must be rated at 2.5 volts each in order to share the 10-volt drop when the switch is turned off. Thus, when designing such a device 100, the number and rating of the series connected FETs is predetermined based on the voltage drop that will be seen across the FETs when the switching device is turned off (i.e., peak voltage/rating for the FETs to be used in the device=the number of FETs that must be connected in series). Additionally, multiple FETs (or multiple sets of series connected FETs) are connected in parallel in order to minimize resistance when the switch is on (Ron) and, thereby, to enhance switch performance. Specifically, to reduce Ron, the channel width of a single FET switch can be widened. However, fabrication limits may prevent widening of the channel width (e.g., beyond 100 µm). Thus, multiple FETs, having narrower channel widths, can be tied in parallel in order achieve the desired wider channel width. For example, in the case of device 100, if device fabrication limits dictate that the channel width of each FET is to be 100 µm and the overall desired channel width for the switching device is 400 µm, then four sets of series connected FETs must be tied in parallel.

Unfortunately, there are several drawbacks to using multiple FETs connected in series and/or in parallel for a switching device, as illustrated in FIGS. 1-3, rather than using a single FET. The additional wiring and contacts required for the additional FETs 111a-d imparts added resistance. Furthermore, the additional FETs 111a-d will have more capacitance than a single FET and require more area on a chip than a single FET. Therefore, there is a need in the art form an improved integrated circuit switching device having minimized series resistance as well as minimized parasitic capacitance in order to avoid signal frequency losses.

In view of the foregoing, disclosed herein are embodiments of an improved integrated circuit switching device that incorporates multiple sets of series connected field effect transistors (FETs) with each set further connected in parallel between two nodes (e.g., between a current source and ground). The sets are arranged in a linear fashion with each set positioned such that it is in contact with and essentially symmetrical relative to an adjacent set. Arranging the sets in this manner allows adjacent diffusion regions of the same type (i.e., sources or drains) from adjacent sets to be merged. Merging of the diffusion regions provides several benefits, including but not limited to, reducing the device size, reducing the amount of required wiring for the device (i.e., reducing resistance) and reducing side capacitance between the now merged diffusion regions and the substrate. Also disclosed are embodiments of an associated design structure for the device and an associated method of forming the device.

Figure 4:
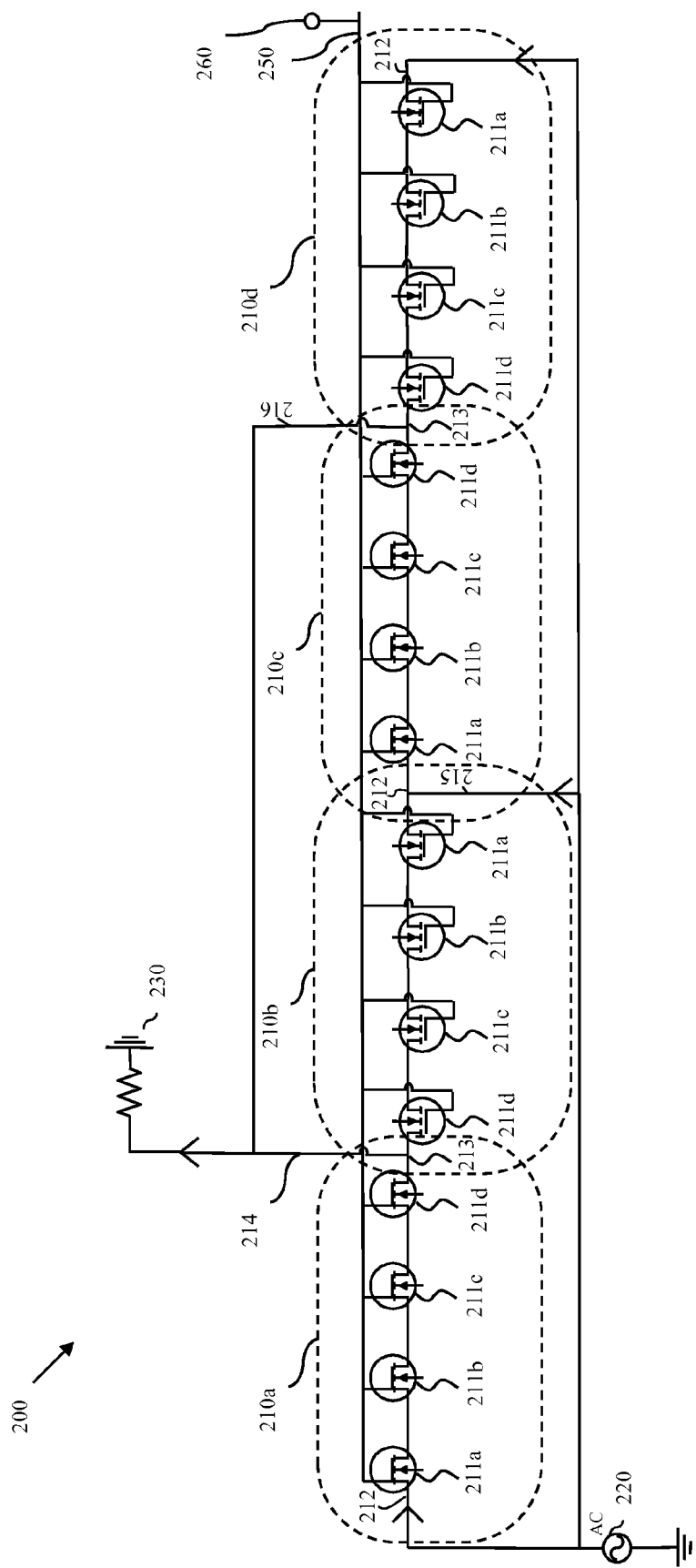
FIG. 4 is a schematic diagram of an embodiment of a multi-FET switching device 200 of the present invention.
Figure 5:
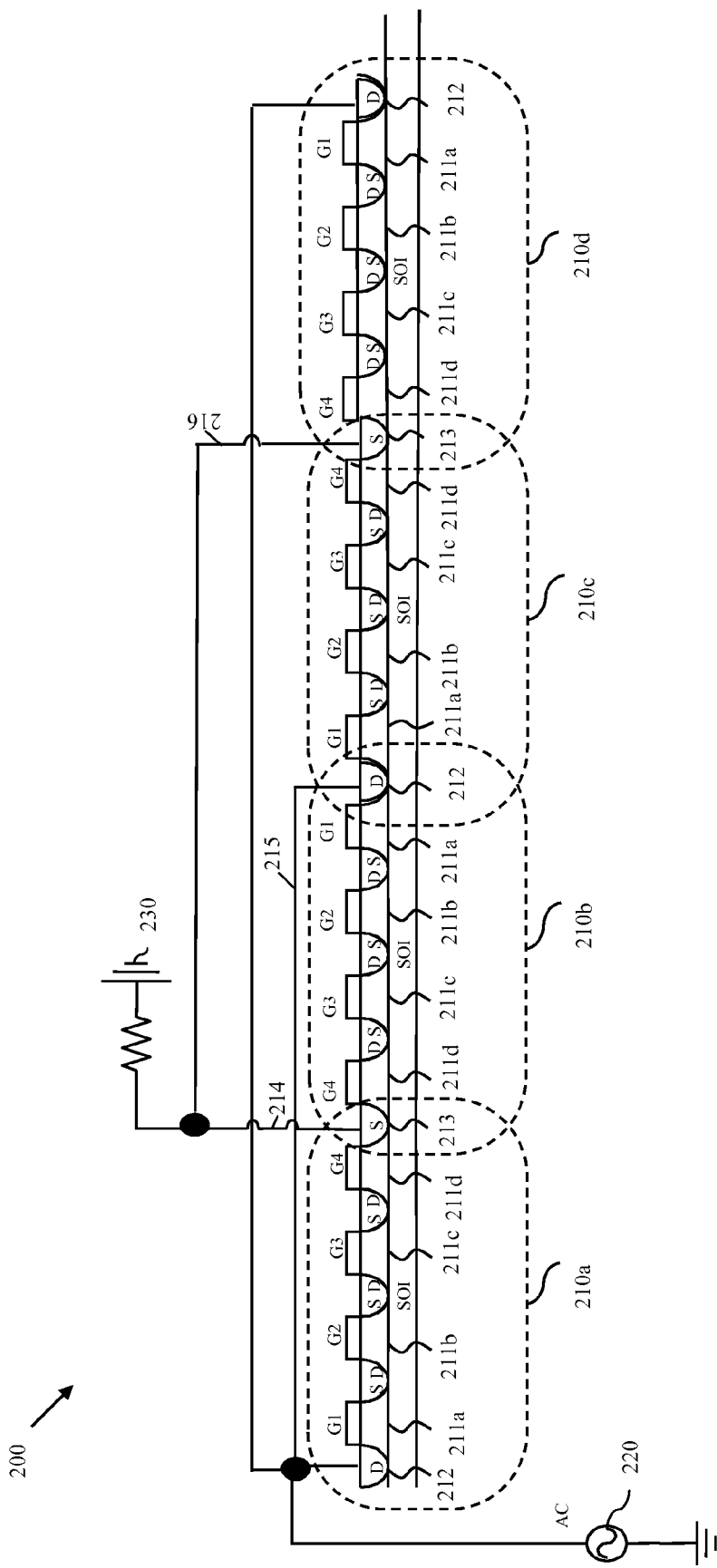
FIG. 5 is a diagram illustrating a cross-section of a die or chip containing such a device 200.
Figure 6:
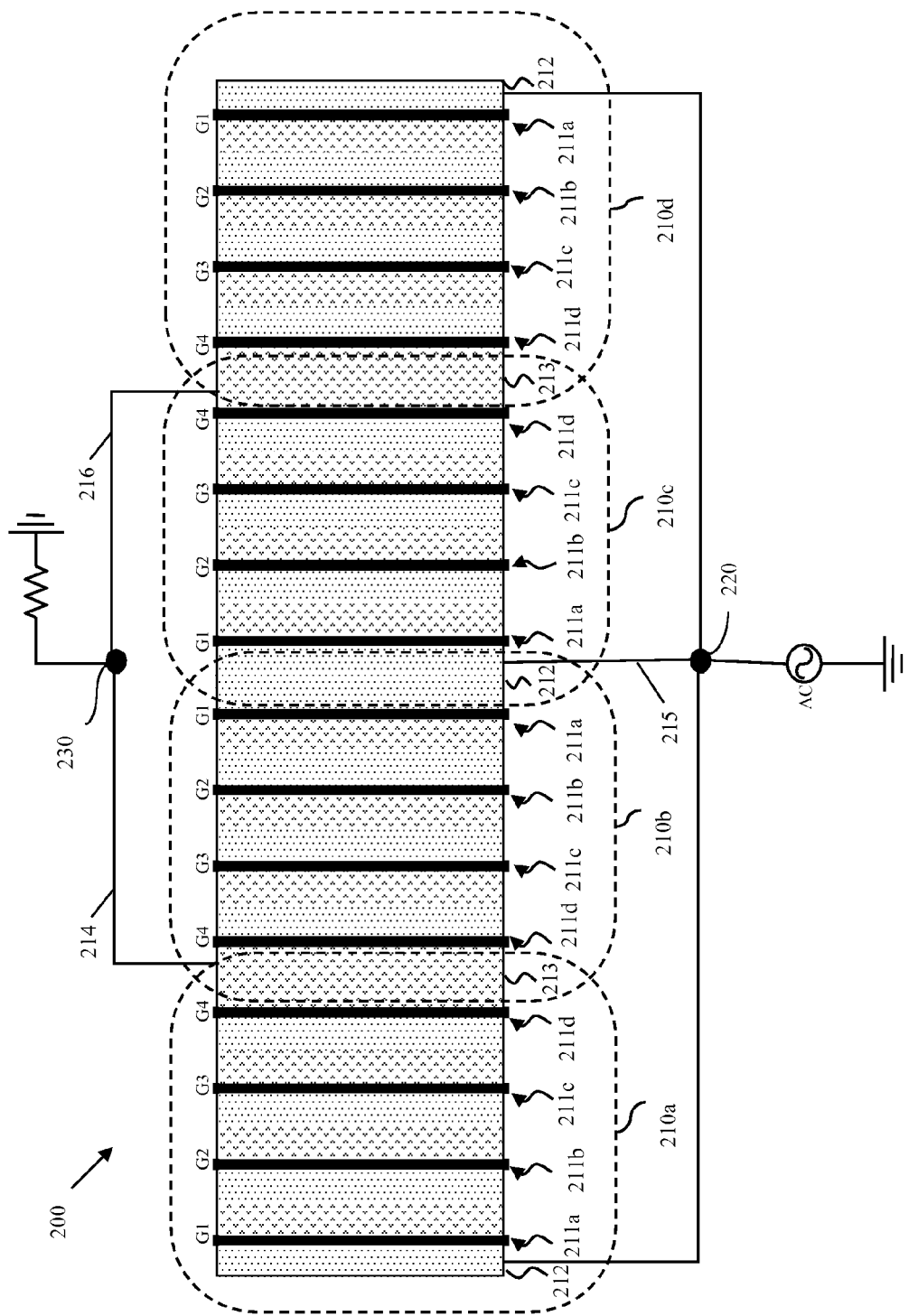
FIG. 6 is a diagram illustrating a top view of a die or chip containing such a device 200.

More particularly, FIG. 4 is a schematic diagram of an embodiment of an integrated circuit switching device 200, according to the present invention, that incorporates multiple field effect transistors (FETs) connected in series and in parallel. FIG. 5 is a diagram illustrating a cross-section of a die or chip containing such a device 200. FIG. 6 is a diagram illustrating a top view of a die or chip containing such a device 200.

Referring to FIGS. 4-6 in combination, disclosed herein are embodiments of an improved integrated circuit switching device 200. The device 200 can comprise a first node 220 and a second node 230. The device 200 can further comprise multiple sets (i.e., blocks, cells, etc.) 210a-d of series connected FETs 211a-d. Each set 210a-d can comprise at least a first FET 211a and a last FET 211d (i.e., an nth FET, see detailed discussion below regarding the number n of FETs in each set). The first FET 211a in each set 210a-d can comprise a first diffusion region 212 (e.g., a drain region) that represents the start of the series and that is electrically connected to the first node 220. The last FET 211d in each set 210a-d can comprise a last diffusion region 213 (e.g., a source region) that represents the end of the series and that is electrically connected to the second node 230. Thus, the multiple sets 210a-d are connected in parallel between the first node 220 and the second node 230.

The number n of FETs 211a-d in each set 210a-d can depend upon the voltage drop expected when the device 200 is turned off and also on the voltage rating of the FETs 211a-d being used. Specifically, each set can have the same number n of series connected FETs and that number n can vary depending upon the expected voltage drop when the switching device 200 is turned off and on the voltage rating of the FETs being used. That is, if the first node 220 is an alternating current source with a specified voltage peak, if the second node 230 is ground, and if each of the FETs in each of sets is rated to the same specified voltage, then the total number n of FETs in each of the multiple sets can be approximately equal to the specified voltage peak of the current source divided by the specified voltage at which the FETs are rated so that the voltage drop that occurs when the device 200 is turned off is shared between the FETs. For example, if the alternating current source 220 has a specified voltage peak of 10 volts and if the FETs being used are rated at 2.5 volts, then the required number n of FETs in each of the multiple sets is four (i.e., 10/2.5) (e.g., as illustrated in FIGS. 4-6). However, if the peak voltage of the current source 220 is 20 volts, then the required number of FETs in each set would be eight (i.e., 220/2.5) and so on.

The number m of sets 210a-d within the device 200 can depend on the desired overall channel width of the device 200 needed to achieve the desired resistance when the device 200 is on (Ron). Specifically, the number m of sets can be approximately equal to the desired overall channel width for the device 200 divided by the channel width of the FETs 211a-d themselves. The channel width of the FETs 211a-d can be determined, for example, based on fabrication limits. Thus, if the desired overall channel width is 400 µm and if the FETs 211a-d being used have a channel width of 100 µm, then four sets of series connected FETs will be required (e.g., as illustrated in FIGS. 4-6). However, if the desired overall channel width of the device 200 is 1 mm, as is typical for current wireless applications, then 10 sets of series connected FETs will be required and so on.

It should be understood that FIGS. 4-6 are offered for illustration purposes and are not intended to be limiting with regard to the number of sets 210a-d or the number of FETs 211a-d within each set. That is, while FIGS. 4-6 illustrate only four FETs 211a-d in each set and only four sets 210a-d in the device 200, it is anticipated that the device 200 may comprise any number n of two or more series connected FETs in each set and any number m of two or more sets, depending upon the application.

As mentioned above, one particular aspect of the device 200 is the merging of first and/or last diffusion regions between adjacent sets. That is, the first diffusion region 212 (i.e., the series starting drain region) and/or the last diffusion region 213 (i.e., the series ending source region) from each set 210a-d can comprise a shared diffusion region with an adjacent set. Specifically, the sets 210a-d are arranged in a linear fashion (i.e., stacked vertically or horizontally) such that each set 210a-d is in contact with and adjacent set and further such that all gates (G1-G4) of all of the FETs 211a-d in all of the multiple sets 210a-d are parallel and aligned. Additionally, each set is "flipped" relative to its adjacent set(s). That is, each set is essentially symmetrical relative to its adjacent set(s) (i.e., is a mirror image of its adjacent set(s)). Arranging the sets 210a-d in this manner ensures that the last diffusion region 213 (i.e., the series ending source region) of the last FET 211d in the first set 210a is merged with (i.e., shared with) the last diffusion region 213 (i.e., the series ending source region) of the last FET 211d in the second set 210b, that the first diffusion region 212 (i.e., the series starting drain region) of the first FET 211a in the second set 210b is merged with the first diffusion region 212 (i.e., the series starting drain region) of the first FET 211a in the third set 210c, and so on. As a result of the arrangement of the sets 210a-d and the shared diffusion regions 212 and 213, a signal will pass through one set of FETs (e.g., a first set 210a) in a first direction and through another set of FETs (e.g., a second set 210b adjacent the first set 210a) in a second direction opposite the first direction.

Figure 7:
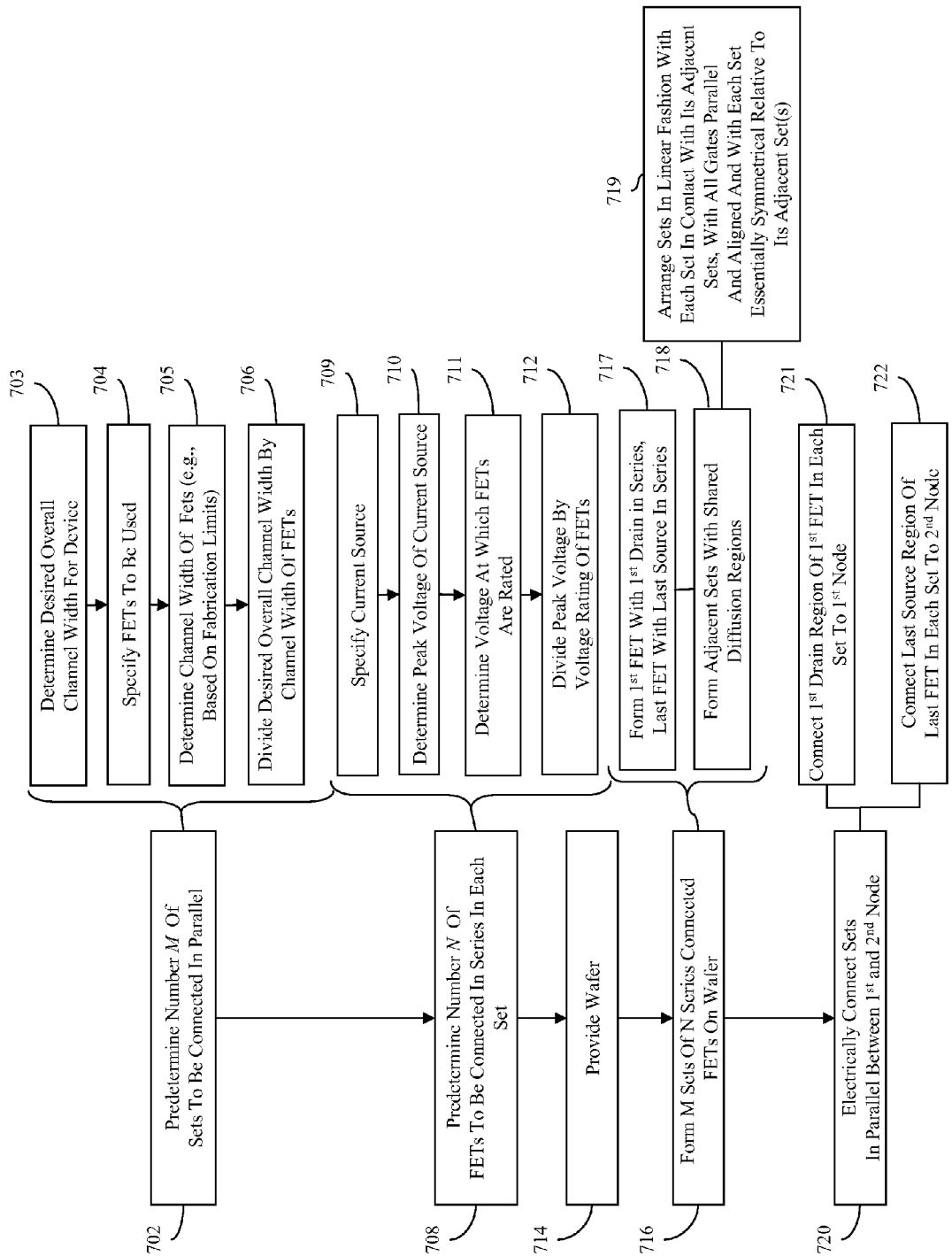
FIG. 7 is a flow diagram illustrating an embodiment of a method of forming the device 200 of FIGS. 4-6.

5Referring to FIG. 7 in combination with FIGS. 4-6, also disclosed herein are embodiments of a method of forming the above-described integrated circuit switching device 200. The method embodiments comprise predetermining the number m of sets (e.g., 210a-d) of series connected FETs (e.g., 211a-d) required for the device 200 (702). Specifically, the desired overall channel width for the device 200 is determined (703). Also, the FET (i.e., type of FET, configuration, etc.) that will be used in the device 200 is specified (704) and the channel width of that FET is determined (705). Next, the desired overall channel width for the device 200 is divided by the channel width of the FET in order to predetermine the required number m of sets (706).

Additionally, the number n of FETs (e.g., 211a-d that will be connected in series in each set (e.g., 210a-d) is also predetermined (708). Specifically, the current source that will be used (i.e., connected, applied, etc.) at the first node 220 is specified (709) and the voltage peak for that current source is determined (710). The voltage rating of the FETs that will be used in the device 200 (i.e., for FETs 211a-d) is also determined (711). Then, the voltage peak of the current source is divided by the voltage at which the FETs are rated in order to predetermine the number n of FETs that are to be connected in series in each set and that will share the resulting voltage drop, when the device 200 is turned off (712).

Next, a wafer (e.g., a silicon-on-insulator (SOI) wafer, a bulk silicon wafer, a bulk semiconductor wafer, etc.) is provided (714) and m sets (e.g., 210a-d) of n series connected FETs (e.g., 211a-d) are formed on the wafer (716). The series connected FETs 211a-d in each set 510a-d are particularly formed such that the first FET 211a comprises a first diffusion region 212 (e.g., a drain region) that represents the start of the series and such that the last FET 211d comprises a last diffusion region 213 (e.g., a source region) that represents the end of the series (717). The series connected FETs 211a-d are further formed such that the first diffusion region 212 and/or the last diffusion region 213 of each set 210a-d comprises a shared diffusion region with an adjacent set (718). This can be accomplished, for example, by arranging the sets 210a-d in a linear fashion such that each set 210a-d is in contact with at least one adjacent set, such that all gates G1-G4 of all of the FETs 211a-d in all of the multiple sets 210a-d are parallel and aligned and such that each set is essentially symmetrical relative to its adjacent set(s) (i.e., is flipped into a mirror image of its adjacent set(s)) (719).

The sets 210a-d are arranged in this manner so as to ensure that the last diffusion region 213 (i.e., the series ending source region) of the last FET 211d in the first set 210a is merged with (i.e., shared with) the last diffusion region 213 (i.e., the series ending source region) of the last FET 211d in the second set 210b, that the first diffusion region 212 (i.e., the series starting drain region) of the first FET 211a in the second set 210b is merged with the first diffusion region 212 (i.e., the series starting drain region) of the first FET 211a in the third set 210c, and so on. Thus, in the resulting structure a signal will pass through one set of FETs (e.g., a first set 210a) in a first direction and through another set of FETs (e.g., a second set 210b adjacent the first set 210a) in a second direction opposite the first direction.

After the multiple sets of series connected FETs are formed at process 716, the multiple sets 210a-d can be electrically connected in parallel between a first node 220 (e.g., to an alternating current (A/C) source) and a second node 230 (e.g., to ground) (720). This can be accomplished by electrically connecting the first diffusion region 212 (i.e., the series starting drain) of each of the multiple sets 210a-d to the first node 220 (721) and further by electrically connecting the last diffusion region 213 (i.e., the series ending source) of each of the multiple sets 210a-d to the second node 230.

Several direct and indirect benefits result from the arrangement of the sets 210a-d in the integrated circuit switching device 200, described above, illustrated in FIGS. 4-6, and formed according to the method of FIG. 7. For example, the required amount of device wiring is reduced because the signal to and/or from adjacent sets passes on common (i.e., shared) wiring between a shared diffusion region and a corresponding node (e.g., see shared wire 214 to shared diffusion region 213 between the first and second sets 210a-b, shared wired 215 to shared diffusion region 212 between the second and third sets 210b-c and share wired 216 to shared diffusion region 213 between the third and fourth sets 210c-d). Reducing the device wiring to the nodes 220, 230 in turn minimizes series resistance when the integrated circuit device 200 is turned on and, thereby enhances device performance.

Additionally, the size of the integrated circuit device 200 can be minimized (i.e., scaled). For example, if a device having 10 sets of 13 series connected 100 µm channel width FETs is configured in the same manner as device 100 of FIG. 1, it will require a total area of 70 µm×214 µm (i.e., ~15000 µm$^2$). However, a similar device (i.e., with 10 sets of 13 series connected 100 µm channel width FETs) configured in the same manner as device 200 of FIGS. 4-6 will only require a total surface area of 100 µm×90 µm (i.e., ~9000 µm$^2$) for a 40% area savings. Scaling the device 200 in turn minimizes several parasitic capacitances that degrade device performance (e.g., side capacitance between the drain/source regions of each FET 211a-d in each set 210a-d to substrate is greatly reduced). The advantages are magnified when this is done in processes that separate the FET body from the substrate such as SOI.

Figure 8:
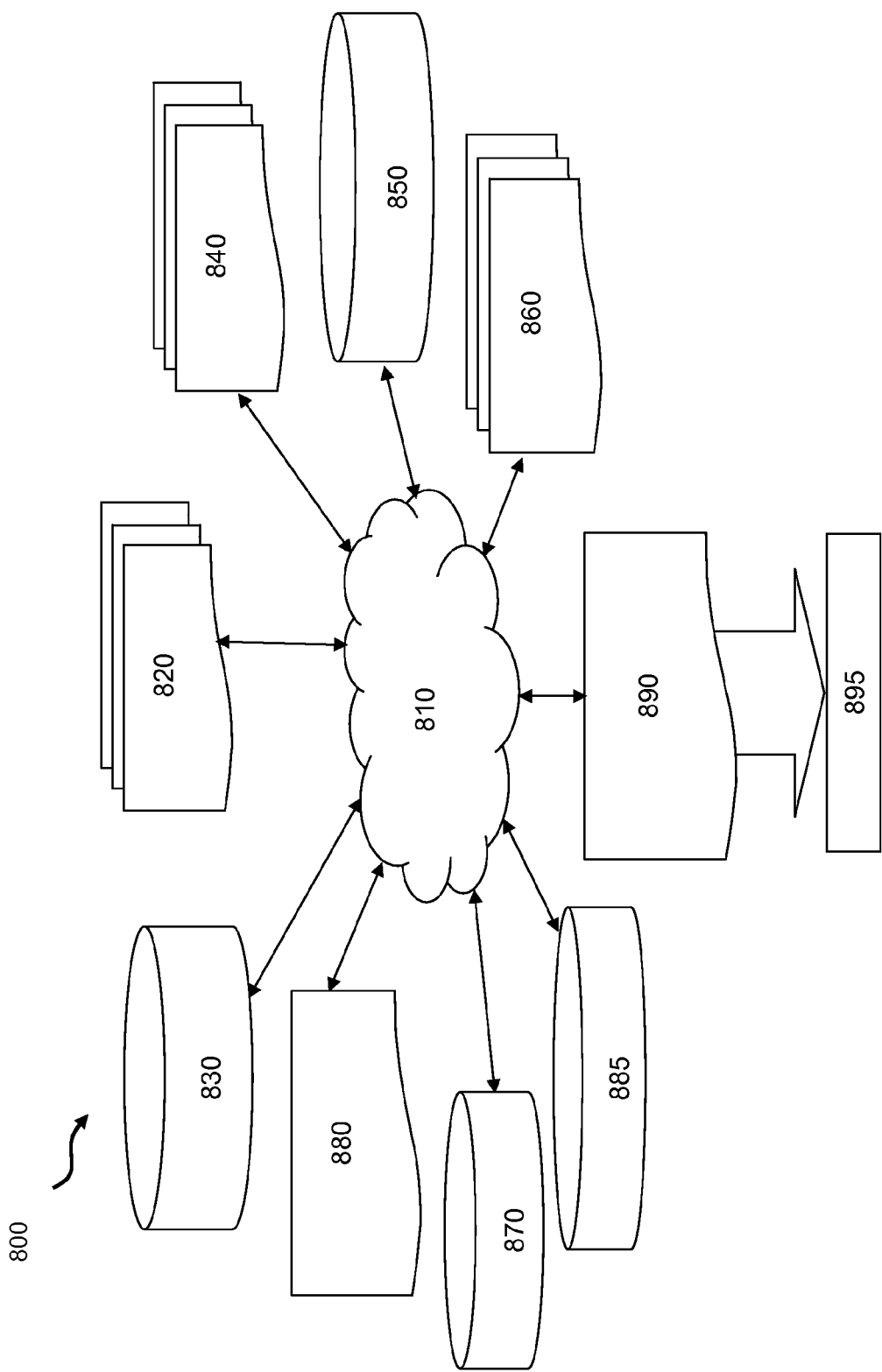
FIG. 8 is an exemplary flow diagram of a design process that can be used for designing, manufacturing and/or testing the circuit embodiments of the present invention.

Also disclosed are embodiments a design structure that is embodied in a machine readable medium and that comprises the integrated circuit switching device 200, as described in detail above and illustrated in FIGS. 4-6. Specifically, FIG. 8 shows a block diagram of an exemplary design flow 800 used for example, in semiconductor design, manufacturing, and/or test. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises an embodiment of the invention as shown in FIGS. 4-6 in the form of schematics or HDL, a hardware-description language (e.g., Verilog, VHDL, C, etc.). Design structure 820 may be contained on one or more machine readable medium. For example, design structure 820 may be a text file or a graphical representation of an embodiment of the invention as shown in FIGS. 4-6. Design process 810 preferably synthesizes (or translates) an embodiment of the invention as shown in FIGS. 4-6 into a netlist 880, where netlist 880 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Design process 810 preferably translates an embodiment of the invention as shown in FIGS. 4-6, along with any additional integrated circuit design or data (if applicable), into a second design structure 890. Design structure 890 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 890 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 4-6. Design structure 890 may then proceed to a stage 895 where, for example, design structure 890: proceeds to tape-out, is released to manufacturing, is released to a mask house, is sent to another design house, is sent back to the customer, etc.

Therefore, disclosed above are embodiments of an improved integrated circuit switching device that incorporates multiple sets of series connected field effect transistors (FETs) with each set further connected in parallel between two nodes (e.g., between a current source and ground). The sets are arranged in a linear fashion with each set positioned such that it is in contact with and essentially symmetrical relative to an adjacent set. Arranging the sets in this manner allows adjacent diffusion regions of the same type (i.e., sources or drains) from adjacent sets to be merged. Merging of the diffusion regions provides several benefits, including but not limited to, reducing the device size, reducing the amount of required wiring for the device (i.e., reducing resistance) and reducing side capacitance between the now merged diffusion regions and the substrate. These benefits are magnified when such a device is formed using a wafer (e.g., a silicon-on-insulator (SOI) wafer) that separates the FET bodies from the substrate. Also disclosed above are embodiments of an associated design structure for the device and an associated method of forming the device.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. An integrated circuit device comprising:
   a first node;
   a second node; and
   multiple sets of series connected field effect transistors,
   wherein each one of said multiple sets comprises:
      a first field effect transistor having a first diffusion region electrically connected to said first node; and
      a last field effect transistor having a last diffusion region electrically connected to said second node such that said multiple sets are connected in parallel between said first node and said second node, and
   wherein at least one of said first diffusion region and said last diffusion region of each set of said multiple sets comprises a shared diffusion region with an adjacent set.

2. The integrated circuit device according to claim 1, all the limitations of which are incorporated herein by reference, wherein each of said multiple sets is positioned adjacent to at least one other set such that all gates of all of said field effect transistors in all of said multiple sets are parallel and aligned.

3. The integrated circuit device according to claim 2, all the limitations of which are incorporated herein by reference, wherein each two adjacent sets of said multiple sets are arranged essentially symmetrically such that a signal will pass through a first set in a first direction and through a second set adjacent to said first set in a second direction opposite said first direction.

4. The integrated circuit device according to claim 1, all the limitations of which are incorporated herein by reference, wherein said first node comprises a current source having an specified voltage peak,
   wherein said second node comprises ground,
   wherein each of said field effect transistors in each of said multiple sets is rated for a specified voltage, and
   wherein a number of said field effect transistors in each of said multiple sets is approximately equal to said specified voltage peak divided by said specified voltage so that a voltage drop that occurs when said integrated circuit device is turned off is shared between said field effect transistors.

5. The integrated circuit device according to claim 1, all the limitations of which are incorporated herein by reference, wherein a number of said multiple sets is approximately equal to a desired overall channel width for said integrated circuit device divided by a channel width for each of said field effect transistors.

6. The integrated circuit device according to claim 1, all the limitations of which are incorporated herein by reference, wherein shared diffusion regions between adjacent sets of said multiple sets reduce wiring requirements and, thereby minimize series resistance when said integrated circuit device is turned on.

7. The integrated circuit device according to claim 1, all the limitations of which are incorporated herein by reference, wherein shared diffusion regions between adjacent sets of said multiple sets allow a size of said integrated circuit device to be scaled and, thereby minimize parasitic capacitance.

8. A method of forming an integrated circuit device comprising:
   providing a wafer;
   forming on said wafer multiple sets of series connected field effect transistors such that each set comprises a first field effect transistor having a first diffusion region and a last field effect transistor having a last diffusion region and further such that at least one of said first diffusion region and said last diffusion region of each of said multiple sets comprises a shared diffusion region with an adjacent set; and
   electrically connecting said multiple sets in parallel between a first node and a second node by electrically connecting said first diffusion region of each of said multiple sets to said first node and said last diffusion region of each of said multiple sets to said second node.

9. The method according to claim 8, all the limitations of which are incorporated herein by reference, wherein said forming of said multiple sets further comprises, arranging said multiple sets on said wafer such that each set is in contact with and essentially symmetrical relative to at least one adjacent set and further such that all gates of all of said field effect transistors in all of said multiple sets are parallel and aligned.

10. The method according to claim 9, all the limitations of which are incorporated herein by reference, wherein said arranging ensures that a signal will pass through a first set in a first direction and through a second set adjacent to said first set in a second direction opposite said first direction.

11. The method according to claim 8, all the limitations of which are incorporated herein by reference, further comprising, before said forming of said multiple sets:
   specifying a current source;
   determining a voltage peak for said current source;
   specifying a field effect transistor to be used in said device;
   determining a voltage at which said field effect transistor is rated; and
   predetermining a number of said field effect transistors to be connected in series in each of said multiple sets by dividing said voltage peak by said voltage so that, when said integrated circuit device is turned off, a voltage drop that occurs is shared between said field effect transistors.

12. The method according to claim 8, all the limitations of which are incorporated herein by reference, further comprising, before said forming of said multiple sets:
   determining a desired overall channel width for said integrated circuit device;
   specifying a field effect transistor to be used in said integrated circuit device;
   determining a channel width of said field effect transistor; and
   predetermining a number of said multiple sets to be incorporated into said integrated circuit device by dividing said desired overall channel width by said channel width.

13. The method according to claim 8, all the limitations of which are incorporated herein by reference, wherein shared diffusion regions between adjacent sets of said multiple sets reduce wiring requirements and, thereby minimize series resistance when said integrated circuit device is turned on.

14. The method according to claim 8, all the limitations of which are incorporated herein by reference, wherein shared diffusion regions between adjacent sets of said multiple sets allow a size of said integrated circuit device to be scaled and, thereby minimize parasitic capacitance.

15. A design structure embodied in a machine readable medium, said design structure comprising an integrated circuit device, said integrated circuit device comprising:
   a first node;
   a second node; and
   multiple sets of series connected field effect transistors,
   wherein each one of said multiple sets comprises:
      a first field effect transistor having a first diffusion region electrically connected to said first node; and
      a last field effect transistor having a last diffusion region electrically connected to said second node such that said multiple sets are connected in parallel between said first node and said second node, and
   wherein at least one of said first diffusion region and said last diffusion region of each set of said multiple sets comprises a shared diffusion region with an adjacent set.

16. The design structure according to claim 15, all the limitations of which are incorporated by reference, wherein said design structure comprises a netlist.

17. The design structure according to claim 15, all the limitations of which are incorporated by reference, wherein said design structure resides on storage medium as a data format used for the exchange of layout data of integrated circuits.

18. The design structure according to claim 15, all the limitations of which are incorporated herein by reference, wherein each of said multiple sets is positioned adjacent to at least one other set such that all gates of all of said field effect transistors in all of said multiple sets are parallel and aligned and wherein each two adjacent sets of said multiple sets are arranged essentially symmetrically such that a signal will pass through a first set in a first direction and through a second set adjacent to said first set in a second direction opposite said first direction.

19. The design structure according to claim 15, all the limitations of which are incorporated herein by reference, wherein shared diffusion regions between adjacent sets of said multiple sets reduce wiring requirements and, thereby minimize series resistance when said integrated circuit device is turned on.

20. The design structure according to claim 15, all the limitations of which are incorporated herein by reference, wherein shared diffusion regions between adjacent sets of said multiple sets allow a size of said integrated circuit device to be scaled and, thereby minimize parasitic capacitance.

* * * * *